(12) United States Patent
Mao et al.

(10) Patent No.: US 8,324,651 B2
(45) Date of Patent: Dec. 4, 2012

(54) ORGANIC LIGHT EMITTING DIODES WITH STRUCTURED ELECTRODES

(75) Inventors: Samuel S. Mao, Castro Valley, CA (US); Gao Liu, Oakland, CA (US); Stephen G. Johnson, Newburyport, MA (US)

(73) Assignee: The Regents of The University of California, Oakland, CA (US)

( * ) Notice: Subject to any disclaimer, the term of this patent is extended or adjusted under 35 U.S.C. 154(b) by 604 days.

(21) Appl. No.: 12/297,615

(22) PCT Filed: Apr. 26, 2007

(86) PCT No.: PCT/US2007/067548
§ 371 (c)(1),
(2), (4) Date: Feb. 4, 2010

(87) PCT Pub. No.: WO2007/127870
PCT Pub. Date: Nov. 8, 2007

(65) Prior Publication Data
US 2010/0127287 A1 May 27, 2010

Related U.S. Application Data

(60) Provisional application No. 60/796,647, filed on Apr. 26, 2006.

(51) Int. Cl.
*H01L 33/00* (2010.01)
(52) U.S. Cl. .............. 257/99; 257/40; 257/E51.001
(58) Field of Classification Search .............. 257/40, 257/99, E51.001
See application file for complete search history.

(56) References Cited

U.S. PATENT DOCUMENTS

| 6,999,222 | B2 | 2/2006 | Bazan et al. |
| 7,431,866 | B2 | 10/2008 | Hsu et al. |
| 2002/0180374 | A1 | 12/2002 | Yamazaki |
| 2004/0102577 | A1* | 5/2004 | Hsu et al. ............ 525/182 |

FOREIGN PATENT DOCUMENTS

| JP | 2001-143874 | 5/2001 |
| JP | 2002-305087 | 10/2002 |
| JP | 2003-051389 | 2/2003 |
| JP | 2003-123990 | 4/2003 |
| JP | 2004-152787 | 5/2004 |
| JP | 2005-216705 | 8/2005 |
| WO | 2004/088766 | 10/2004 |

OTHER PUBLICATIONS

WO patent application No. PCT/US07/67548, International Search Report and Written Opinion mailed Feb. 20, 2008.

(Continued)

*Primary Examiner* — Anthony Ho
(74) *Attorney, Agent, or Firm* — Weaver Austin Villeneuve & Sampson LLP

(57) ABSTRACT

A cathode that contain nanostructures that extend into the organic layer of an OLED has been described. The cathode can have an array of nanotubes or a layer of nanoclusters extending out from its surface. In another arrangement, the cathode is patterned and etched to form protruding nanostructures using a standard lithographic process. Various methods for fabricating these structures are provided, all of which are compatible with large-scale manufacturing. OLEDs made with these novel electrodes have greatly enhanced electron injection, have good environmental stability.

4 Claims, 13 Drawing Sheets

OTHER PUBLICATIONS

EP patent application No. 07761379.2, Supplemental European Search Report mailed May 26, 2011.

JP patent application No. 2009-507958, Notice of Reasons for Rejection mailed Nov. 8, 2011.

Kukhta, A.V. et al., "Nanostructured alumina as a cathode or organic light-emitting devices," Surface Science 507-510 (2002) 593-597.

JP patent application No. 2009-507958, Office Action mailed Jun. 12, 2012.

* cited by examiner

ORGANIC LIGHT EMITTING DIODES WITH STRUCTURED ELECTRODES

CROSS-REFERENCE TO RELATED APPLICATIONS

This application claims priority to U.S. Provisional Patent Application 60/796,647, filed Apr. 26, 2006, which is incorporated by reference herein.

STATEMENT OF GOVERNMENTAL SUPPORT

The invention described and claimed herein was made in part utilizing funds supplied by the U.S. Department of Energy under Contract No. DE-AC02-05CH11231. The U.S. Government has certain rights in this invention.

TECHNICAL FIELD

The present invention relates to electronic devices that incorporate organic layers. More particularly, the present invention relates to structured cathodes for devices such as organic light emitting diodes ("OLEDs"), solar cells, and the like.

BACKGROUND ART

Efficient film devices, including organic photovoltaic and organic electroluminescent devices have been the subject of much advancement recently. In particular, organic light emitting small molecules and polymers have attracted increasing interest for manufacture of large area, low cost light emitting devices. They can be used as the light-producing elements in television screens, computer displays, advertising and information board applications, and the like. OLEDs can also be used in lighting devices.

Organic light-emitting diodes (OLEDs) use an electroluminescent conductive polymer or small molecule that emits light when subjected to an electric current. They can be used to make full-spectrum color displays and require a relatively small amount of power for the light produced. No vacuum is required, and the emissive materials can be deposited onto a substrate by a technique derived from commercial inkjet printing or vapor deposition processes. The diodes can be made on either rigid or flexible substrates.

The radically different manufacturing process of OLEDs lends itself to many advantages over flat panel displays made with LCD technology. OLEDs can be printed onto any suitable substrate using inkjet printer or even screen printing technologies, which can result in a significantly lower cost than LCDs or plasma displays. In addition, printing OLEDs onto flexible substrates opens the door to new applications, such as roll-up displays and displays embedded in curtains, clothing, and the like.

OLEDs enable a greater range of colors, brightness, and viewing angle than LCDs, because OLED pixels emit light directly. OLED pixel colors appear correct and unshifted, even as the viewing angle approaches 90 degrees from normal. LCDs use a backlight and cannot show true black, while an "off" OLED element produces no light and consumes no power. Energy is wasted in LCDs because they require polarizers which filter out about half of the light emitted by the backlight. Additionally, color filters in color LCDs filter out two-thirds of the light.

As shown in the schematic in FIG. 1, an OLED 100 has an emissive layer 110, a transport layer 120, an anode 130 and a cathode 140, all on a substrate 150. The layers 110, 120 are made of organic semiconducting small molecules or polymers. When a voltage is applied across the OLED 100 such that the anode 120 is positive with respect to the cathode 140, the cathode 140 injects electrons 145 into the emissive layer 110 and the anode 130 injects holes 135 into the transport layer 120. The electrons 145 and the holes 135 move toward each other and they recombine. The recombination produces an emission of radiation 160 whose frequency is typically in the visible, may also be in the infrared and ultraviolet regions.

The electron orbitals in electroluminescent organic small molecules or polymers are analogous to the valence and conduction band edges in an inorganic semiconductor; states below the highest occupied molecular orbital (HOMO) are occupied and those above the lowest unoccupied molecular orbital (LUMO) are empty. The HOMO and LUMO are separated by an energy gap, normally in the optical energy range. Thus when an electron makes a transition from the LUMO to the HOMO, visible light can be generated.

Indium tin oxide (ITO) is commonly used as the anode material. It is transparent to visible light and has a high work function, which promotes injection of holes into the organic layer. Metals such as aluminum and calcium are often used for the cathode as they have relatively low work functions, which promote injection of electrons into the organic light emitting layer.

Unlike organic small molecules, electroluminescent polymers are long chain hydrocarbon-based conjugated molecules with molecular weights of several hundred thousand atomic units. They can be applied to substrates by spin coating or printing to form amorphous films. Typical polymers used in OLED displays include derivatives of poly(p-phenylene vinylene) and poly(fluorene). Substitution of side chains onto the polymer backbone may determine the color of emitted light or the stability and solubility of the polymer for desired performance and ease of processing.

There are several obstacles that must be overcome before the potential of OLED technology can be realized commercially. The interface between the cathode and organic layers in OLEDs presents a barrier for electron ejection, which reduces electron ejection efficiency and can lead to a significantly large device operating voltage with reduced overall device efficiency. Additionally, the barrier results in an increase in temperature at the interface which may damage the device. Temperatures can reach over 100° C., which can cause severe damage to an OLED. Another obstacle involves the stability of the OLED. Exposure to the environment (e.g., heat, $H_2O$ and $O_2$) can be particularly damaging, leading to marked deterioration in device performance. Lastly, much of the light that is emitted by the organic molecules in an OLED remains trapped in the device and does not reach the viewer.

Generally, when the cathode and anode electrode work functions match the respective LUMO and HOMO levels in the organic material, it is easy to inject a steady supply of electron and hole pairs into the polymer to generate light. While a thin layer of transparent conductor indium tin oxide (ITO) has become the standard material for the anode, the optimal cathode material has yet to be developed. It is generally believed that, for the cathode, lowering the energy barrier between a metal contact and the LUMO of polymer promotes efficient injection of electrons. Therefore, a variety of low work function metals, especially alkali metals, have been widely used to reduce operating voltage and improve device efficiency.

Although alkali or alkali earth metals display the lowest work function (2-3 eV) of all elemental metals, thus suitable for cathode applications, their reactive nature and the associated fabrication cost have been a major challenge for the realization of low cost, high efficient OLED devices. Therefore, development of cathodes with sub-wavelength size structures such as carbon nanotubes and nanotube-alkali composite networks, and arrays of stable low work function alloy nanoclusters may improve device deficiency by lowering the driving voltage and increasing device stability and light extraction.

DISCLOSURE OF INVENTION AND BEST MODE FOR CARRYING OUT THE INVENTION

Embodiments are described herein in the context of organic light emitting diodes with structured electrodes. Those of ordinary skill in the art will realize that the following detailed description is illustrative only and is not intended to be limiting in any way. Other embodiments will suggest themselves readily to skilled persons having the benefit of this disclosure.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the invention make significant improvements in the charge injection characteristics of the cathode of OLED devices using field emission structures, thus increasing electrical-optical energy conversion efficiency. The cathode structures disclosed herein are also substantially insensitive to oxygen and water, making processing and packaging of OLEDs easier and increasing the useful lifetime of the devices.

Field emission is an effective source for electron ejection into OLED layers. When subject to a sufficiently high electric field, electrons near the Fermi level of the cathode material can overcome the energy barrier to escape to the vacuum level. The basic physics of electron emission is well known. Low operating voltages can be used to extract electrons when the field emitter is made of a low work function material and/or has a very small tip radius.

To develop efficient OLEDs, cathodes are developed based on structures having dimensions that are less than the wavelength of visible light (~0.5 µm). The cathode structure elements are smaller than the OLED emission wavelength, so essentially the cathode layer cannot absorb light. Additionally, sub-wavelength structures can reduce heating effects at the metal-polymer interface due to their large surface area-to-volume ratio, therefore mitigating the damaging effects of heat in these devices and achieving greater device reliability.

DEFINITIONS

Carbon nanotubes are basically carbon molecule sheets organized into a cylindrical shape. "Carbon nanotube" as used herein is meant to include single wall and multi-wall carbon nanotubes unless specified otherwise. Any size or diameter, including metallic and semiconducting n-type and p-type nanotubes, non-cylindrical nanotubes, and mixtures of carbon and other atoms are all contemplated as useful for the embodiments of the invention.

The term "nanostructure" means a structure with at least one dimension in the nanometer range. For the purposes of this disclosure, the term "nanostructure" is used more loosely to include structures with at least one dimension in the micron range.

Nanotube and Nanocluster Cathodes

FIG. 2 is a schematic cross section drawing that shows an embodiment of the invention that uses a nanotube-based cathode. An OLED 200 has a cathode 240, a light-emitting organic layer 210, a transport layer 220, an anode 230, and a substrate 250. The anode 230 may be made of a transparent material, such as indium tin oxide (ITO) and the substrate 250 may be any known substrate such as plastic, glass, and the like. Light may be emitted in the direction of arrows 260 or in the opposite direction.

The cathode 240 has a plurality of nanostructures 242 extending outwardly into the light-emitting organic layer 210. The nanostructures 242 may be any type of structure such as nanotubes, nonorods, or nanoclusters. The nanostructures 242 can be nanotubes grown out from a cathode substrate 240. Alternatively, the nanostructures 242 can be nanoclusters deposited onto the cathode substrate 240.

Nanotubes are good field emitters because of their small tip radii, which can range from approximately one nanometer to as much as a micron. The smaller the tip radius the stronger the concentration of the electric field at the tip. A high electric field at the tip causes a high electron ejection rate, which results in very efficient ejection of electrons. In addition to improving electron injection from the cathode 240 to the light-emitting organic layer 210, the small tips and even distribution of the nanotubes 242 provide a balanced charge distribution in the device, reduce exciton quenching near the cathode 240, and allow for the use of lower voltages to achieve electron emission. Furthermore, carbon nanotubes are chemically stable, decreasing the environmental sensitivity of the cathode 240.

The nanotubes used herein may be n-type or p-type for the purpose of balancing the charge transfer in the conductive small molecule or polymer matrix. One having ordinary skill in the art will appreciate how to optimize this balance.

The nanotubes may be associated with the conductive polymer such that the polymer side chains wrap around the nanotube and are bonded to them by Van der Waal forces.

In another embodiment, doped nanotube-alkali composites can also improve electron injection into the light emitting polymers. It has been shown previously that the electronic properties of Li-doped carbon-46 molecules display metallic behavior with a very low work function, approximately 1.5 eV. Thus, carbon nanotubes doped with composites such as Li, Mg, or their alloys have very low work functions, which can provide further improvements in the electron injection efficiency.

In one embodiment of the invention, a template-assisted alignment of nanotube arrays is used to form a structured cathode for an OLED device. The template approach, which is based on confined deposition of materials inside nanometer scale pores of self-organized anodic aluminum oxide or other materials, is becoming increasingly important for fabricating arrays of aligned nanostructures. This method enables easy integration of nanostructured electrodes with functional OLED devices.

FIG. 3 is a flow diagram that describes steps for forming a structured electrode with an aligned nanotube array, according to an embodiment of the invention. In step 400 an aluminum film is deposited onto a substrate. The substrate can be any of a variety of materials. The substrate with film is placed in an electrochemical cell in step 302. The cell can contain, for example, nitric acid. Using the substrate with aluminum as an anode, a voltage is applied in step 304. The voltage can be between approximately 10 and 500 volts. A cathode (e.g., platinum) is provided as part of the cell. As current flows, self-organized pores form in the aluminum layer and the remaining aluminum is oxidized to form $Al_2O_3$ (alumina) thus forming a template on the substrate.

For process A, nanoclusters are deposited into the pores in step 310. Precursor gas is used with either chemical vapor deposition or ultra fast laser ablation. For example, transport of a carbon-alkali gas into the holes or pores may be through laser ablation of a graphite-alkali composite sample. In step 312, unwanted residue is removed from the template using an acidic solution. In step 324, mechanical polishing or ion milling of the resulting structure provides a thin film of aligned nanostructure arrays on a substrate, ready to be bonded to the emissive layer of an OLED.

For process B, a metal catalyst (e.g., Ni, Fe, Co) is deposited onto the template and into the pores, in step 320. In step 322, catalyst on the surface of the alumina is removed by ion milling, leaving catalyst in the pores of the template on the substrate. In step 324, an array of nanotubes is grown from the remaining catalyst in the pores. The cathode is ready to be bonded to the emissive layer of an OLED.

FIG. 4 shows a diagram of an alumina template on a substrate as described above. A template 405 with pores 415 is positioned over a substrate 425. Only small regions 435 of the substrate 425 are available for receiving catalyst and subsequent nucleation and growth of nanotubes.

FIGS. 5A, 5B, and 5C show performance data collected from OLED devices with carbon nanotube structured cathodes compared with data from standard devices with non-structured cathodes. The devices have the same structure except for the cathodes. With reference to FIG. 2, the substrate 205 is glass, the anode 230 is ITO, the transport layer 220 is poly(3,4-ethylenedioxythiophene) poly(styrenesulfonate) (PEDOT:PSS), and the emissive layer 210 is poly[2-methoxy-5-(2'-ethyl-hexyloxy)-1,4-phenylene vinylene] (MEH-PPV). The cathode 240 is simply aluminum for the standard device and is aluminum with carbon nanotubes 242 extending into the emissive layer 210 for the device with the structured electrode.

FIG. 5A is a plot of light intensity as a function of wavelength for the standard device 510 and for the device with the carbon nanotube cathode 520. There is no significant change in the emission spectrum with the use of the structured cathode with the nanotube layer.

FIG. 5B is a plot of current density as a function of voltage for the standard device 530 and the device with the carbon nanotube cathode 540. There is a significant increase in the current density for the structured cathode. This suggests enhanced electron injection from the structured nanotube cathode.

FIG. 5C is a plot of brightness as a function of voltage for the standard device 550 and the device with the carbon nanotube cathode 560. There is a significant increase in the brightness for the structured cathode.

Lithographically-Defined Cathodes

FIG. 6 is a schematic cross section drawing that shows an embodiment of the invention that uses a cathode with lithographically-defined microstructures or nanostructures. Cathodes with lithographically-defined microstructures can improve OLED device performance due to enhanced electron injection as discussed above for nanostructures. Although the term "nanostructures" is used in the following discussion, it should be understood that this is meant to include microstructures also. An OLED 600 has a cathode 640, a light-emitting organic layer 610, a transport layer 620, an anode 630, and a substrate 650. The anode 630 may be made of a transparent material, such as indium tin oxide (ITO) and the substrate 650 may be any known substrate such as plastic, glass, and the like. Light may be emitted in the direction of arrows 660 or in the opposite direction. The cathode 640 has a plurality of lithographically-defined nanostructures (or microstructures) 644 extending outwardly into the light-emitting organic layer 610.

The cathode 640 has a plurality of lithographically-defined nanostructures 644 extending outwardly from the cathode 640 into the emissive layer 610. The nanostructures 644 are low work function metal or metallic alloy materials.

Alkali metals have very low work functions and therefore can be expected to enhance electron emission if they are used as OLED cathodes. However, it has been found that alkali metal layers provide maximum enhancement of electron emission when they are less than about one monolayer thick. Unfortunately, alkali metals are physically and chemically unstable, and it is extremely difficult to fabricate and maintain such thin alkali metal layers.

Lithographically-defined nanostructures 644 can be formed from metals such as aluminum (Al), or metallic alloys such as copper (Cu)-lithium (Li). Alloy cathodes overcome the drawbacks exhibited in conventional alkali film cathodes. Low work function (e.g., Li) layers on the surface of a host metal (e.g., Cu) can increase electron emission current density and lower threshold voltage. It has been shown that in Cu—Li alloys, a monolayer of Li can segregate to the surface of the alloy to form a thermodynamically stable, low-work function, alkali metal layer. A Li monolayer on the surface of the alloy leads to charge transfer between the metal conduction band and the Li adsorbate atom, giving rise to an effective work function even lower than that of the elemental alkali metal alone.

FIG. 7 is a flow diagram that shown the steps for forming a structured electrode with lithographically-defined nanostructures. Photoresist is applied to a metal substrate in step 700. For process A, the metal substrate can be aluminum, or an alloy suitable as OLED cathode. For process B, the substrate can be any kind of solid material suitable for lithographic processing. In step 702, using a standard photolithography process, a mask is used to pattern the photoresist and the photoresist is developed and cleaned. In step 704, the remaining pattern on the metal substrate is etched to form trenches. In step 706, the remaining photoresist and any etch residue is removed. The pattern is not limited to long lines that form trenches when etched. Any pattern that can result in nanostructures protruding from the substrate after etching can be used.

In process A, step 710, the etched metal substrate is the lithographically-defined nanostructure cathode and can bonded to an emissive polymer layer in an OLED.

In process B, step 720 the etched metal substrate is used as a stamp. In step 722, the etched metal substrate is pressed against an emissive polymer layer in an OLED to form a pattern of ridges and trenches. In step 724, a metal, such as aluminum, is deposited onto the stamped organic layer to fill the trenches and form a lithographically-defined nanostructure cathode.

Alternatively, the photoresist can be applied to the emissive polymer layer of an OLED, and subsequent steps 702, 704, 706, can performed on the polymer layer, leaving the polymer layer with a pattern of ridges and trenches. Then a metal, such as aluminum, can be deposited onto the polymer layer to fill the trenches and form a lithographically-defined nanostructure cathode, as in step 724.

FIG. 8 is an atomic force microscope image that shows a metal cathode or stamp surface that has been etched to form long microstructured ridges. The bright areas are ridges, and the dark areas are the trenches.

FIGS. 9A, 9B, and 9C show performance data collected from OLED devices with lithographically-defined structured cathodes compared with data from standard devices with non-structured cathodes. The devices have the same structure except for the cathodes. With reference to FIG. 6, the substrate 605 is glass, the anode 630 is ITO, the transport layer 660 is poly(3,4-ethylenedioxythiophene) poly(styrenesulfonate) (PEDOT:PSS), and the emissive layer 610 is poly [6-methoxy-5-(6'-ethyl-hexyloxy)-1,4-phenylene vinylene] (MEH-PPV). The cathode 640 is simply aluminum for the standard device and is aluminum with lithographically-defined aluminum nanostructures 644 extending into the emissive layer 610 for the device with the structured electrode.

FIG. 9A is a plot of light intensity as a function of wavelength for the standard device (solid line) 910 and for the device with the carbon nanotube cathode (dashed line) 920. There is no significant change in the emission spectrum with the use of the structured cathode with the lithographically-defined nanostructures.

FIG. 9B is a plot of current density as a function of voltage for the standard device 930 and the device with the lithographically-defined nanostructure cathode 940. There is a significant increase in the current density for the structured cathode. This suggests enhanced electron injection from the structured nanotube cathode.

FIG. 9C is a plot of brightness as a function of voltage for the standard device 950 and the device with the lithographically-defined nanostructure cathode 960. There is a significant increase in the brightness for the structured cathode.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

INDUSTRIAL APPLICABILITY

Figure 1:
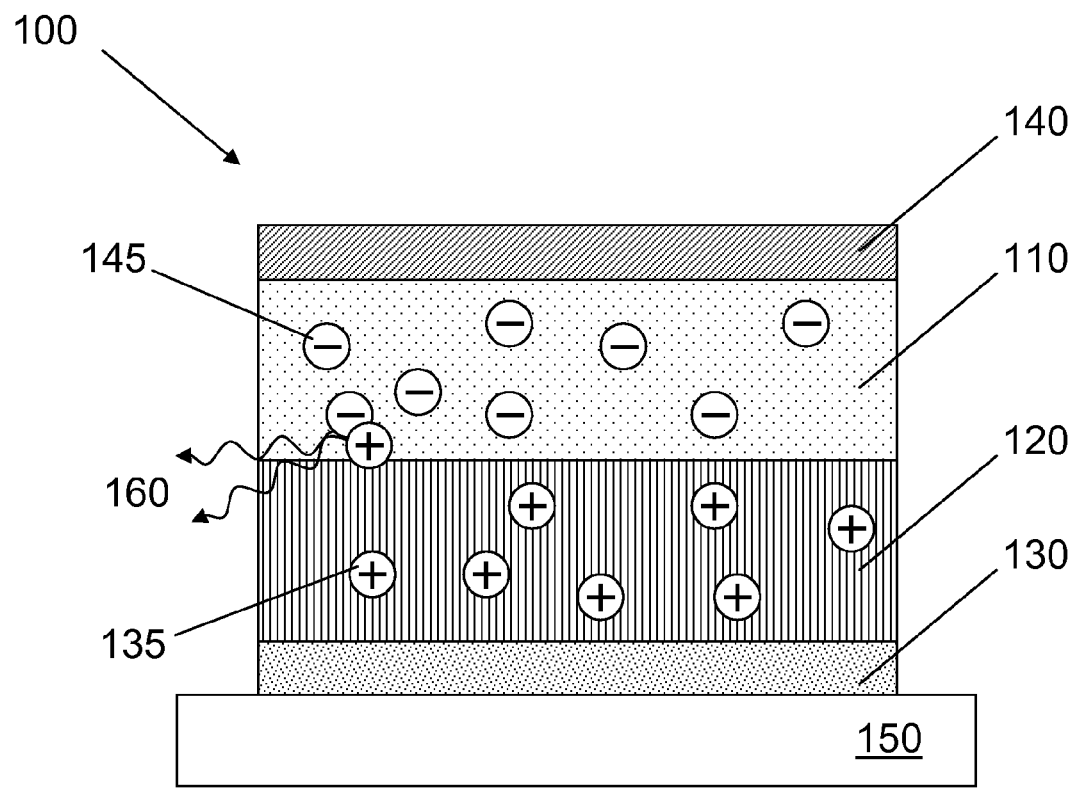
FIG. 1 is a schematic drawing that shows the basic components of an OLED.
Figure 2:
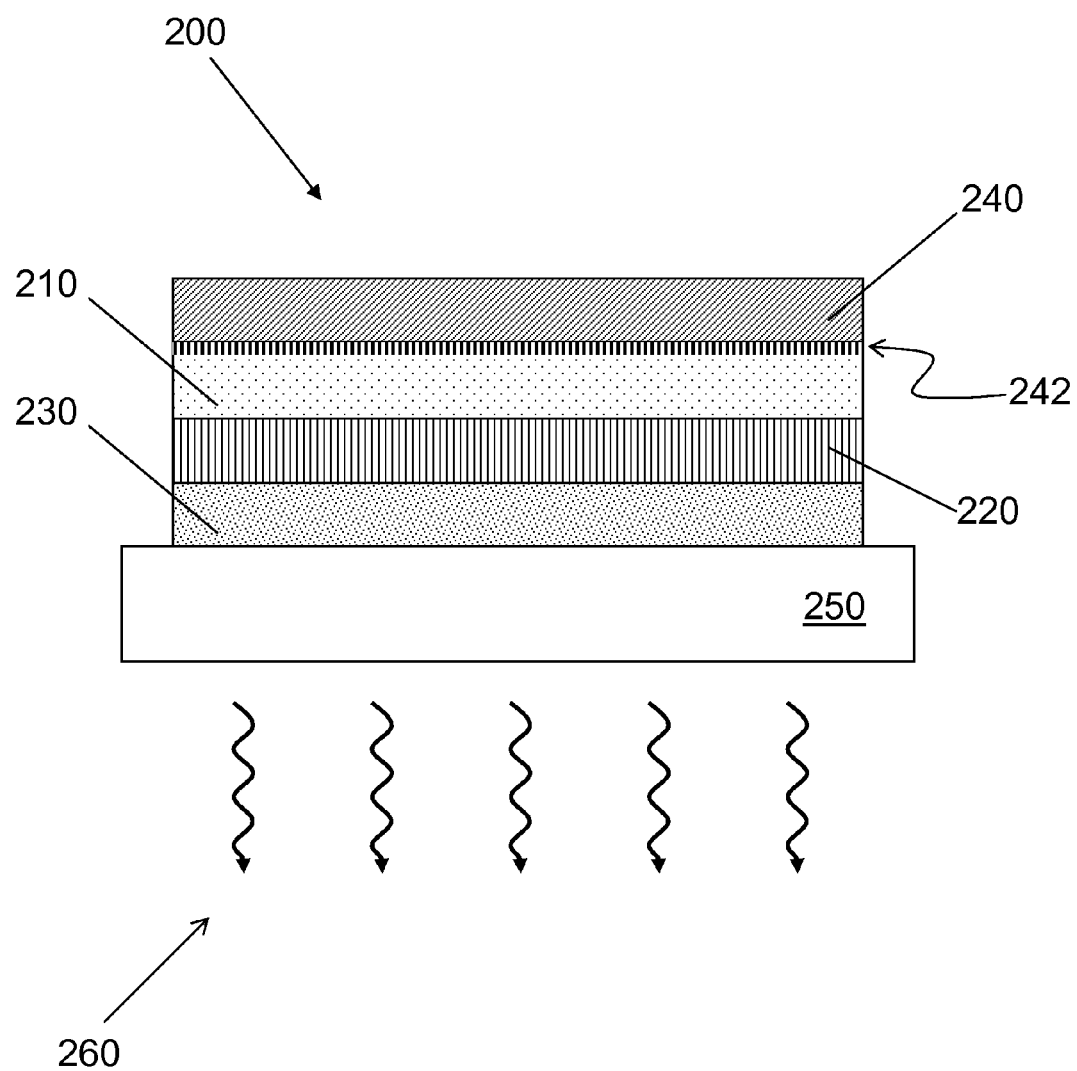
FIG. 2 is a schematic drawing that shows the basic components of an OLED with a nanotube structured cathode according to an embodiment of the invention.
Figure 3:
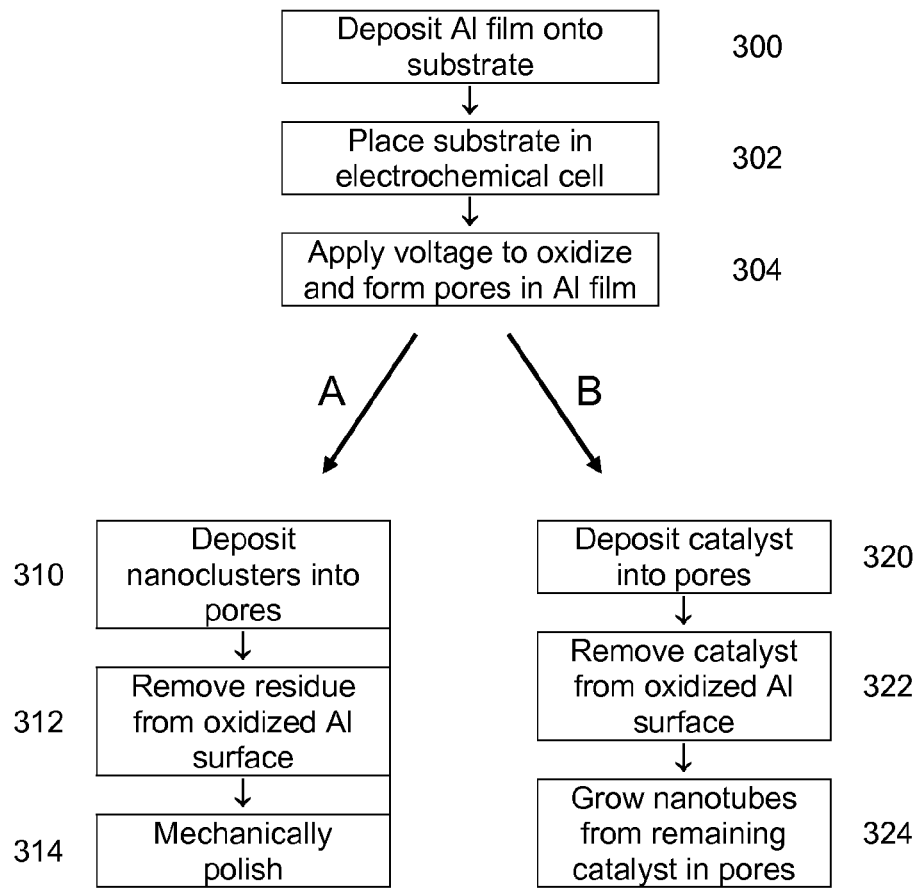
FIG. 3 is a flow diagram that outlines the steps for forming a nanotube structured cathode, according to an embodiment of the invention.
Figure 4:
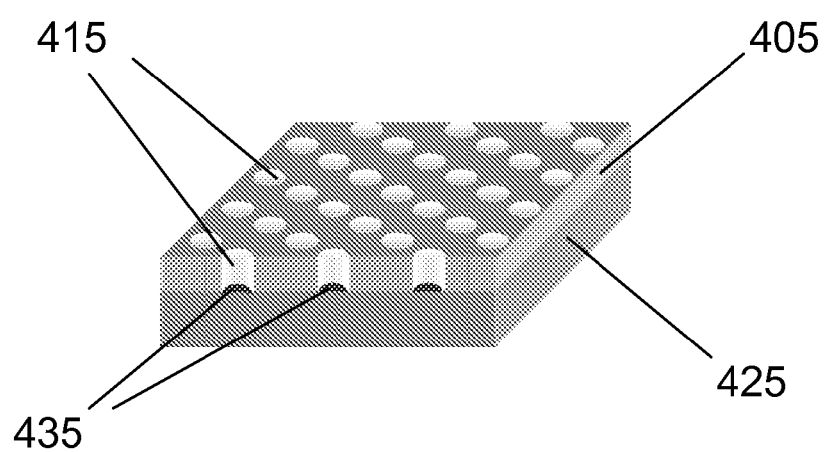
FIG. 4 is a diagram showing an oxidized aluminum template with pores for growing a nanotube array.
Figure 5A:
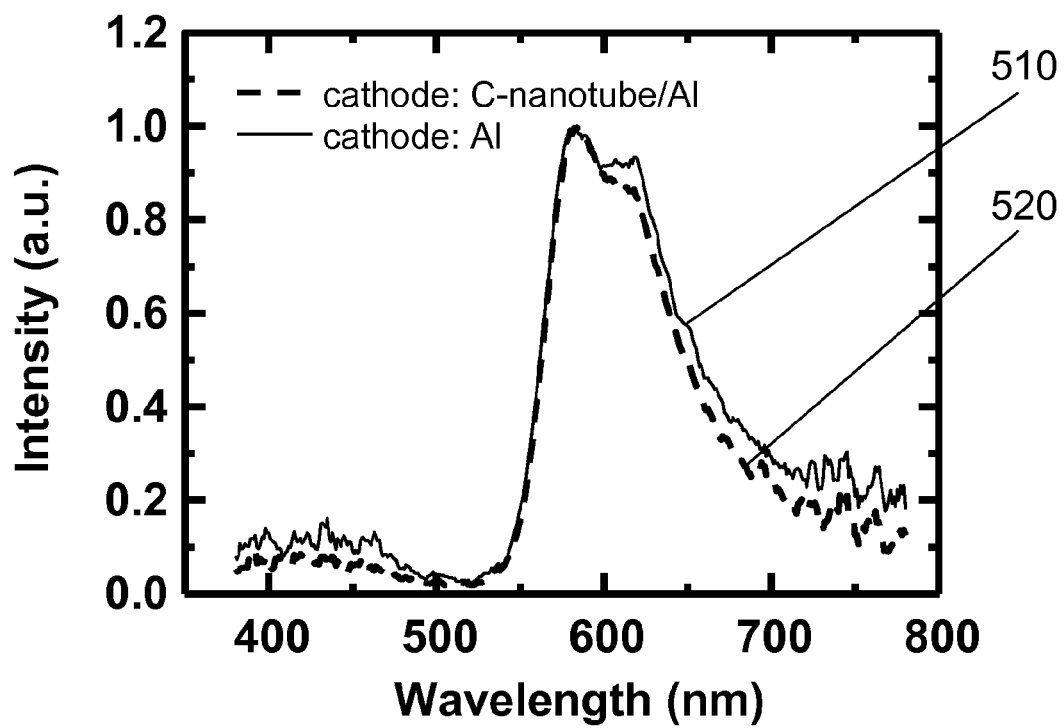
FIGS. 5A, 5B, 5C show performance data from a standard OLED with a non-structured cathode and from a nanotube structured cathode.
Figure 5B:
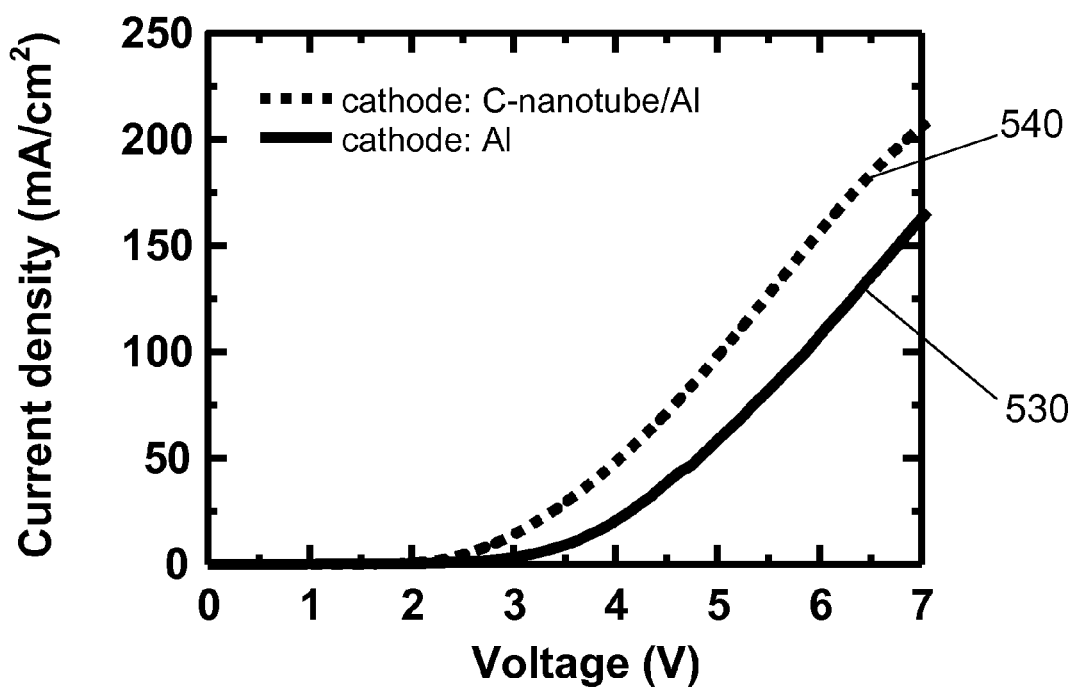
Figure 5C:
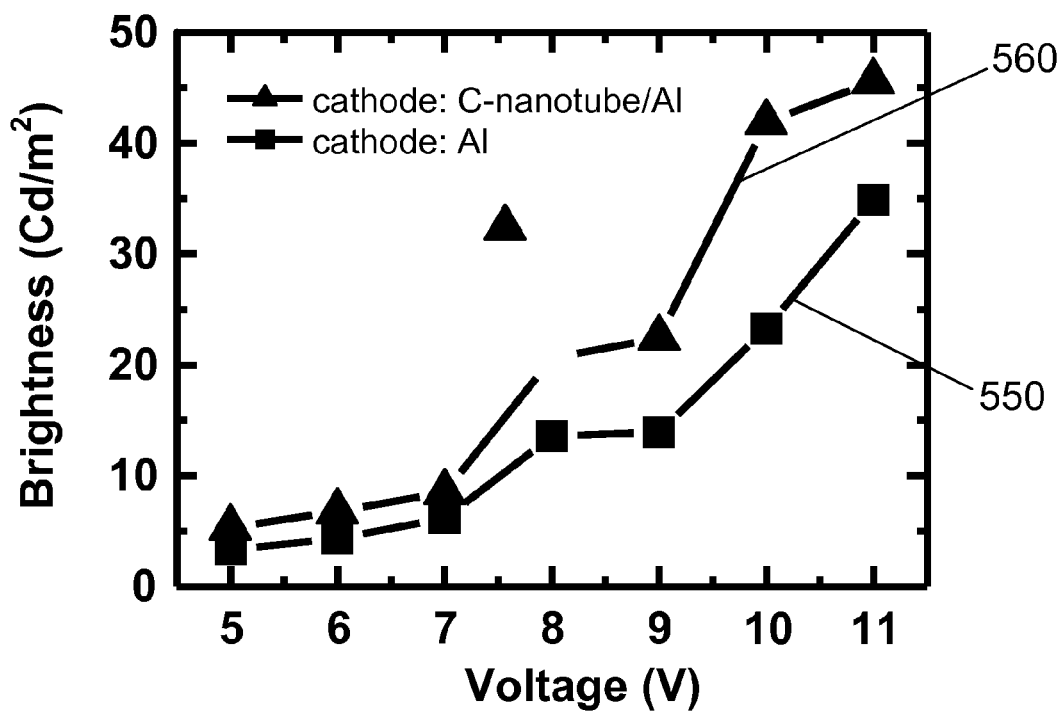
Figure 6:
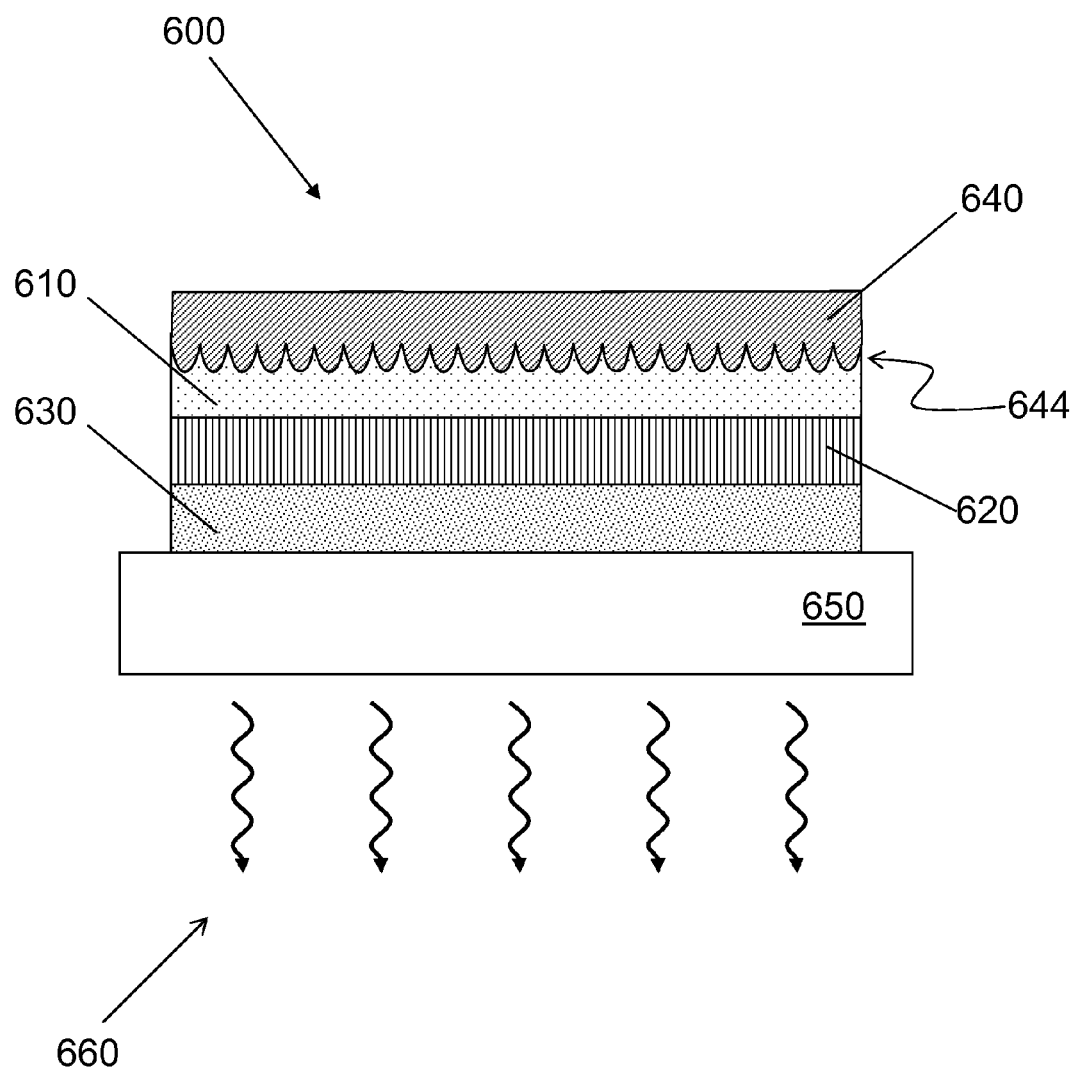
FIG. 6 is a schematic drawing that shows the basic components of an OLED with a lithographically-defined nanostructure cathode according to an embodiment of the invention.
Figure 7:
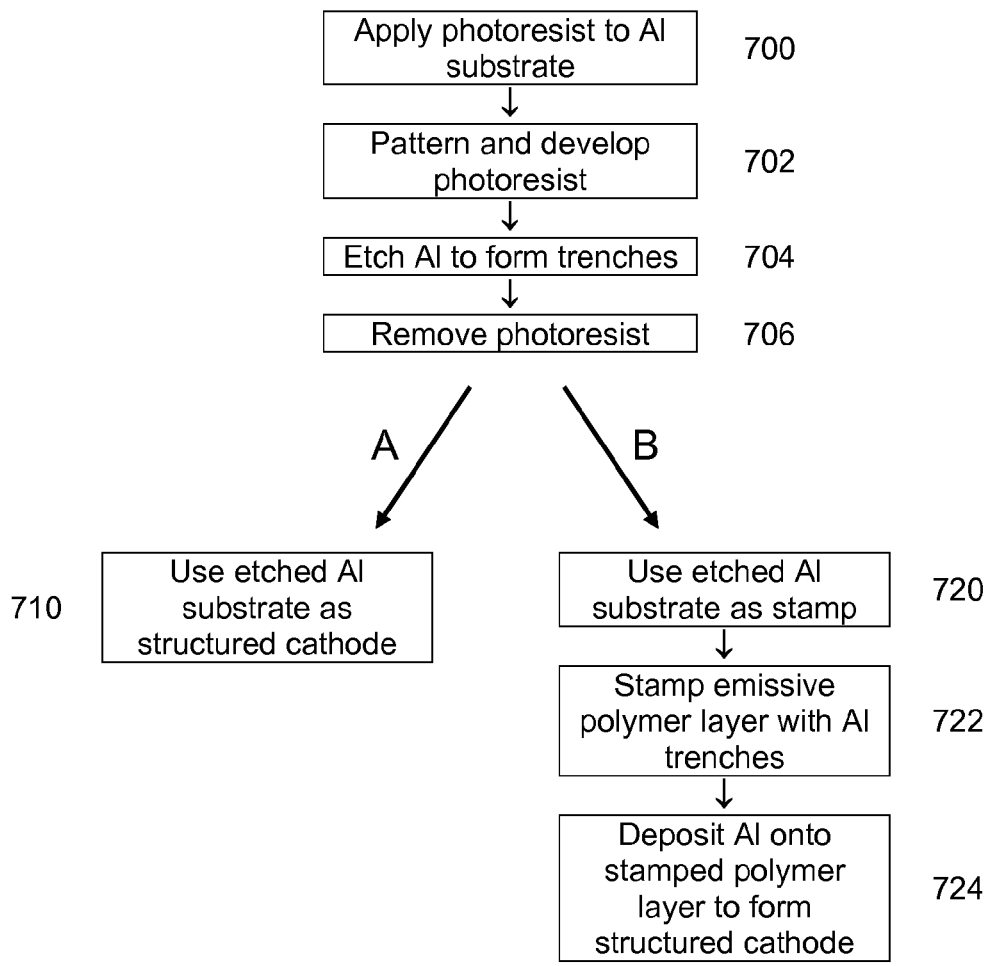
FIG. 7 is a flow diagram that outlines step for forming lithographically-defined nanostructure cathodes, according to embodiments of the invention.
Figure 8:
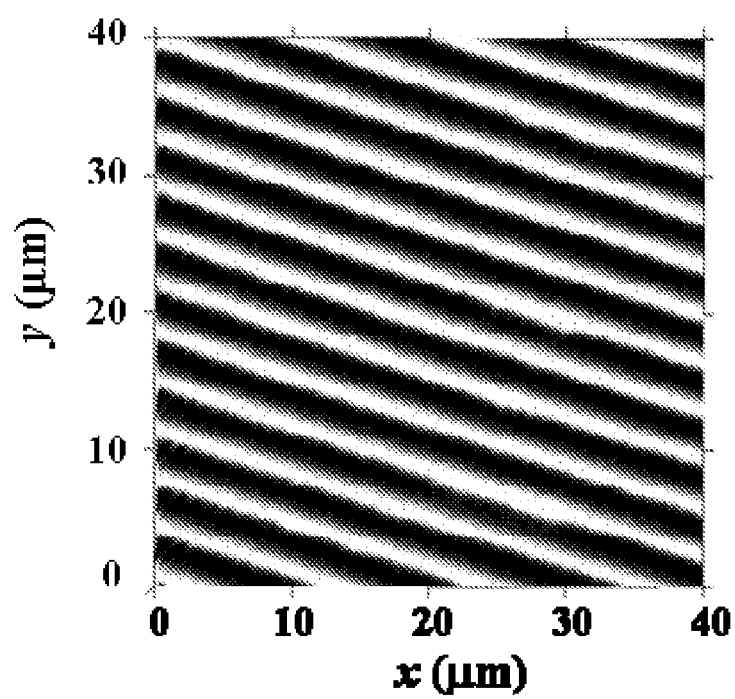
FIG. 8 is an atomic force microscopy image of an etched aluminum substrate for a lithographically-defined nanostructure cathode.
Figure 9A:
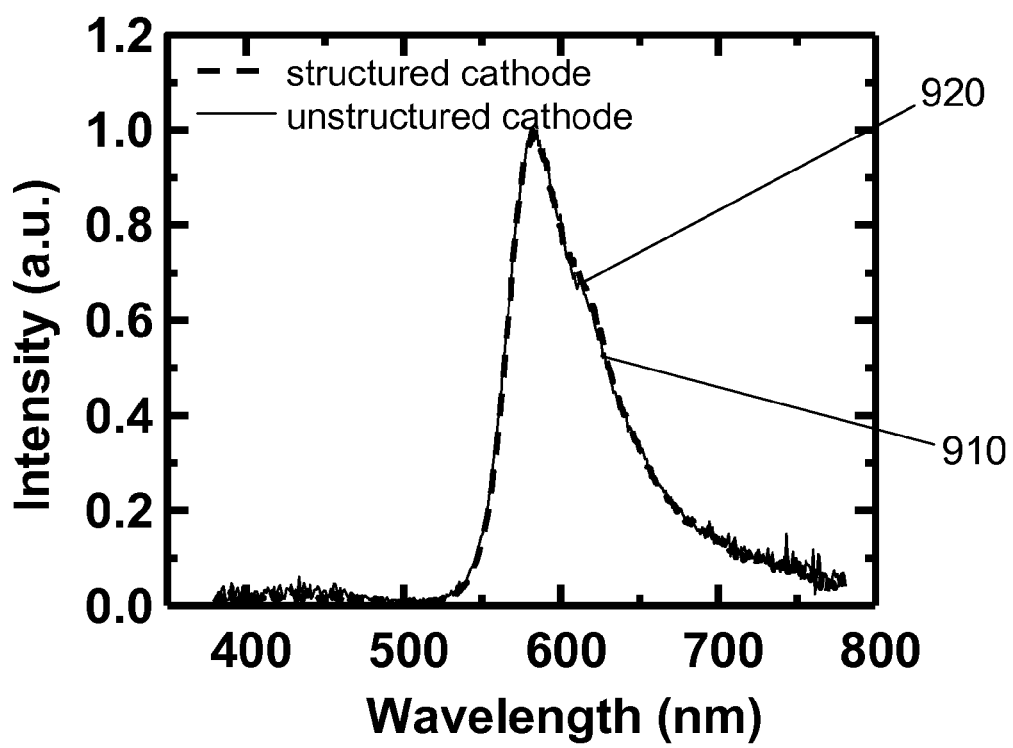
FIGS. 9A, 9B, 9C show performance data from a standard OLED with a non-structured cathode and from a lithographically-defined nanostructure cathode.
Figure 9B:
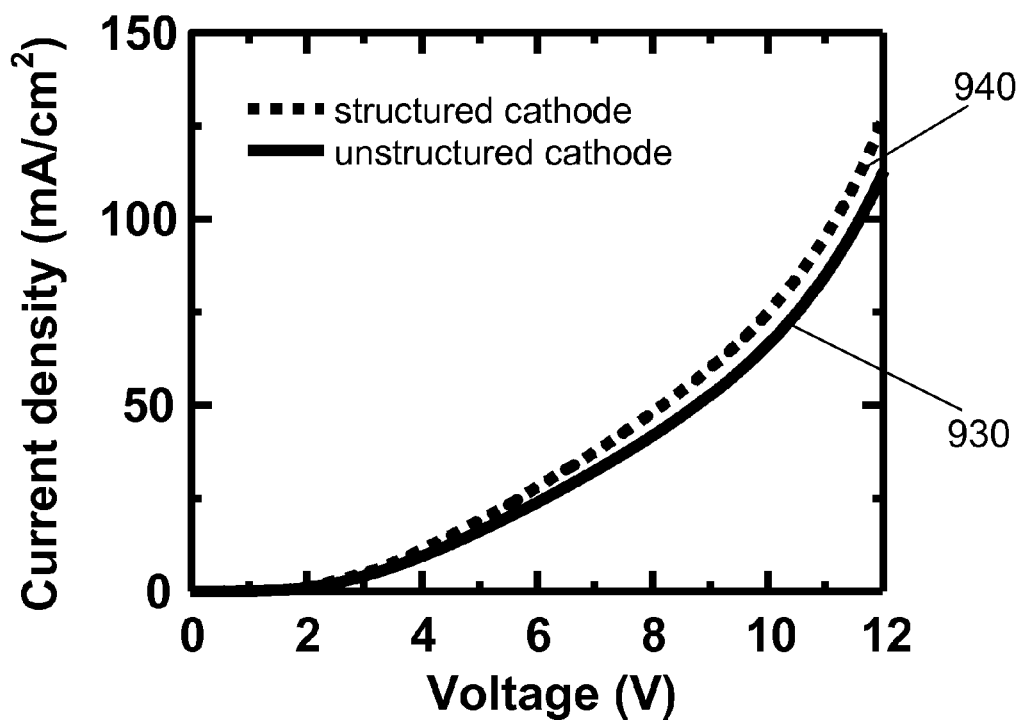
Figure 9C:
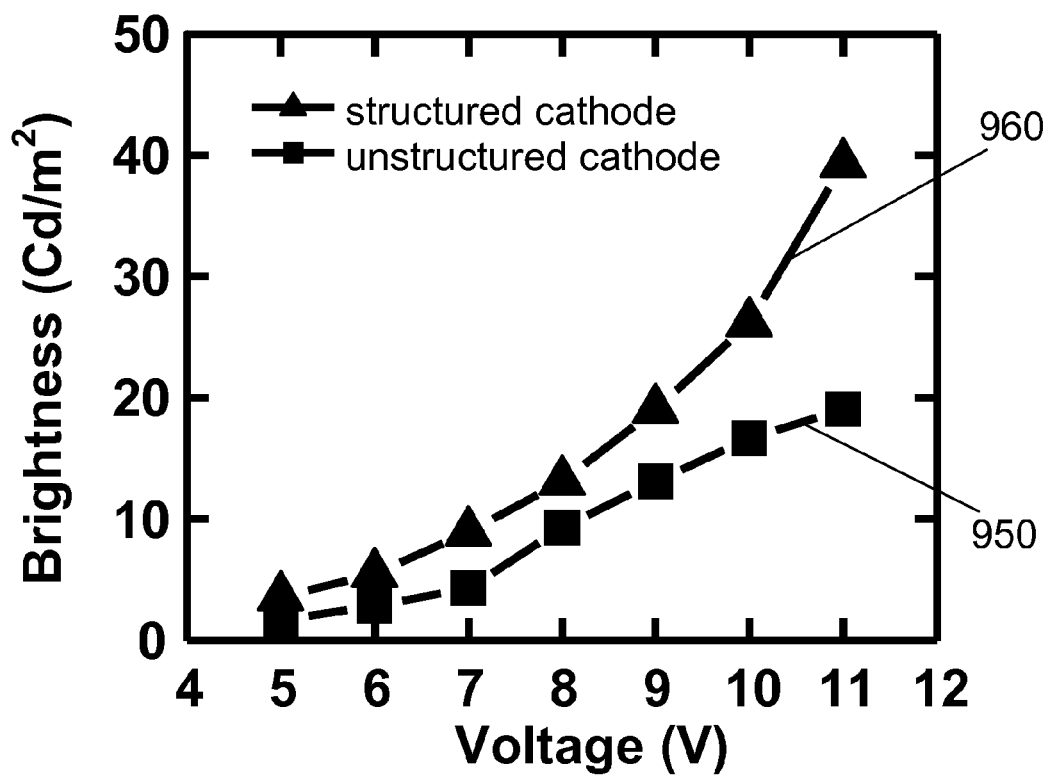

OLED technology is used in commercial applications such as small screens for mobile phones and portable digital audio players (MP3 players), car radios, digital cameras and high-resolution displays for head-mounted displays. Such portable applications favor OLEDs because of their high light output, their readability in sunlight, and their low power drain. Prototypes have been made of flexible and rollable displays which use unique OLEDs characteristics.

OLEDs can also be used as solid-state light sources and there is much interest in using them for general illumination. OLED efficiencies and long life already exceed those of incandescent light bulbs, The embodiments of the invention disclosed and claimed herein offer higher brightness with lower power consumption for OLEDs than have been available before.

We claim:

1. A structured electrode, comprising:
   an electrode substrate;
   a plurality of lithographically-defined nanostructures extending outwardly from the electrode substrate, the plurality of nanostructures comprising an alkali metal composite;
   wherein each of the plurality of nanostructures comprises an alkali metal composite comprising a Cu—Li metallic alloy.

2. An organic light emitting diode device, comprising:
   a cathode comprising a plurality of lithographically-defined nanostructures extending outwardly from the cathode;
   an organic layer coupled to the cathode nanostructures,
   wherein the plurality of nanostructures extend into the organic layer, the plurality of nanostructures comprising an alkali metal composite;
   wherein each of the plurality of nanostructures comprises an alkali metal composite comprising a Cu—Li metallic alloy.

3. The device of claim 2, further comprising an anode coupled to the organic layer.

4. The device of claim 3, further comprising a substrate coupled to the anode.

* * * * *